United States Patent

Okazaki et al.

[11] Patent Number: 5,966,396
[45] Date of Patent: Oct. 12, 1999

[54] GALLIUM NITRIDE-BASED COMPOUND SEMICONDUCTOR LASER AND METHOD OF MANUFACTURING THE SAME

[75] Inventors: Haruhiko Okazaki, Yokohama; Hidetoshi Fujimoto, Kawasaki; Masayuki Ishikawa, Yokohama; Shinya Nunoue, Ichikawa; Genichi Hatakoshi, Yokohama; Masahiro Yamamoto, Sagamihara, all of Japan

[73] Assignee: Kabushiki Kaisha Toshiba, Kawasaki, Japan

[21] Appl. No.: 08/900,127

[22] Filed: Jul. 25, 1997

[30] Foreign Application Priority Data

Jul. 26, 1996 [JP] Japan .................................. 8-197855

[51] Int. Cl.⁶ .................................................. H01S 3/19
[52] U.S. Cl. ................................ 372/46; 372/45
[58] Field of Search ...................... 372/45, 46; 437/151

[56] References Cited

U.S. PATENT DOCUMENTS

| | | | |
|---|---|---|---|
| 4,972,238 | 11/1990 | Tanaka | 372/46 |
| 5,321,713 | 6/1994 | Khan et al. | 372/45 |
| 5,400,355 | 3/1995 | Ishida | 372/46 |
| 5,547,899 | 8/1996 | Fujii et al. | 437/151 |
| 5,617,438 | 4/1997 | Hatano et al. | 372/45 |
| 5,701,322 | 12/1997 | Nagai | 372/46 |
| 5,740,192 | 4/1998 | Hatano et al. | 372/45 |
| 5,777,350 | 7/1998 | Nakamura et al. | 372/45 |

FOREIGN PATENT DOCUMENTS 8-97510  4/1996  Japan .

*Primary Examiner*—Rodney Bovernick
*Assistant Examiner*—Quyen Phan Leung
*Attorney, Agent, or Firm*—Oblon, Spivak, McClelland, Maier & Neustadt, P.C.

[57] ABSTRACT

A semiconductor laser is formed from a gallium nitride-based compound semiconductor material, and has a double-heterostructure portion obtained by sandwiching an active layer between an n-type cladding layer and a p-type cladding layer on a sapphire substrate. The double-heterostructure portion is formed into a mesa shape on the sapphire substrate via a GaN buffer layer. The two sides of this mesa structure are buried with GaN current blocking layers.

13 Claims, 14 Drawing Sheets

GALLIUM NITRIDE-BASED COMPOUND SEMICONDUCTOR LASER AND METHOD OF MANUFACTURING THE SAME

BACKGROUND OF THE INVENTION

1. Field of the Invention

The present invention relates to a semiconductor device using a gallium nitride-based compound semiconductor material and, more particularly, to a gallium nitride-based compound semiconductor laser for emitting short-wavelength light, and a method of manufacturing the same.

2. Discussion of the Background

In recent years, gallium nitride-based compound semiconductors such as GaN have received a great deal of attention as a material for a short-wavelength light-emitting diode and a semiconductor laser from the blue to ultraviolet range. Particularly, a blue semiconductor laser using this material series has been expected to be applied as a light source for high-density information processing because of its short oscillation wavelength.

To oscillate a semiconductor laser with a low-threshold current, carrier injection into an active layer, and light confinement must be efficiently performed. To efficiently inject carriers into the active layer, a double-heterojunction having a p-n junction, and a current constriction structure are important. To efficiently confine light, formation of an optical waveguide having a large refractive index difference is important.

In a gallium nitride-based compound semiconductor laser, however, only formation of an optical waveguide by a mesa, or a surface emission semiconductor laser has been proposed. Any other structures and manufacturing methods have rarely been reported. In this conventional semiconductor laser, carrier injection and light confinement are not sufficient. In addition, in a mesa optical waveguide, the p-side contact area is small, resulting in high-device-resistance characteristics. With another compound semiconductor material, carrier injection and light confinement can be efficiently performed by filling the two sides of the mesa with current blocking layers. With the gallium nitride-based compound semiconductor material, such an arrangement cannot be directly applied.

This is because the gallium nitride-based compound semiconductor material is difficult to cause crystal growth and to obtain a high crystal quality. For this reason, the mesa is difficult to be formed into a desired shape by exposing a desired surface by etching. Further, the gallium nitride-based compound semiconductor material is very difficult to be regrown at a step portion formed upon mesa etching. As described above, the mesa is difficult to be formed into a desired shape by exposing a desired surface by mesa etching. As a result, the two sides of the mesa becomes more difficult to be buried.

In this manner, in the semiconductor laser using the gallium nitride-based compound semiconductor material, carrier injection and light confinement are not always sufficient, and the threshold cannot be decreased. In the mesa optical waveguide, the contact area of a contact portion (generally on the p side) opposite to the substrate is small, resulting in high-device-resistance characteristics.

BRIEF SUMMARY OF THE INVENTION

The present invention has been made in consideration of the above situations, and has as its object to provide a gallium nitride-based compound semiconductor laser which can satisfactorily inject carriers and confine light at a double-heterostructure portion using a gallium nitride-based compound semiconductor material, and can be used as a short-wavelength light source that oscillates at a small threshold, and a method of manufacturing the same.

According to a first aspect of the present invention, there is provided a gallium nitride-based compound semiconductor laser, comprising:

a support substrate;

a mesa stripe formed on the support substrate via a buffer layer, the mesa stripe having a double-heterostructure obtained by sandwiching an active layer between first and second cladding layers of different conductivity types;

a current blocking layer buried in two sides of the mesa stripe; and first and second electrodes connected to the first and second cladding layers, wherein each of the buffer layer, the active layer, and the first and second cladding layers consists essentially of a material represented by the following composition formula:

$$In_xGa_yAl_zB_{1-x-y-z}N$$

where $0 \leq x, y, z, x+y+z \leq 1$.

According to a second aspect of the present invention, there is provided a method of manufacturing a gallium nitride-based compound semiconductor laser, comprising the steps of:

forming a buffer layer on a support substrate;

forming a stacked film on the buffer layer, the stacked film having a double-heterostructure obtained by sandwiching an active layer between first and second cladding layers of different conductivity types;

selectively etching the stacked film to form a mesa stripe;

leaving the obtained structure in a vapor phase at a high temperature to re-evaporate crystals, thereby partially removing two sides of the active layer of the mesa stripe;

leaving the resultant structure in a vapor phase at a high temperature to grow crystals, thereby forming mass transport layers on at least removed portions on the two sides of the active layer; and burying two sides of the mesa stripe with a current blocking layer, wherein each of the buffer layer, the active layer, and the first and second cladding layers consists essentially of a material represented by the following composition formula:

$$In_xGa_yAl_zB_{1-x-y-z}N$$

where $0 \leq x, y, z, x+y+z \leq 1$.

According to the present invention, instead of directly forming a double-heterostructure made of a gallium nitride-based compound semiconductor material on a substrate made of sapphire or the like, a buffer layer made of a gallium nitride-based compound semiconductor material is formed on a substrate, and a double-heterostructure is formed thereon. With this structure, crystal growth for the double-heterostructure can be relatively easily caused, and the quality of each crystal can be improved. For this reason, a mesa stripe having a desired shape can be formed by exposing a desired surface by etching for forming a mesa stripe. Therefore, the gallium nitride-based compound semiconductor material can be easily regrown at a step portion formed upon mesa etching, and the side portion of the mesa stripe can be buried with a current blocking layer.

If the two sides of the mesa stripe are buried with the current blocking layers, carriers can be efficiently injected into an active layer. If the refractive index of the current blocking layer is set lower than that of the active layer, light can be confined in the active layer to decrease the oscillation threshold. Particularly when the active layer has a multiple quantum well structure, the oscillation threshold can be further decreased. When the two sides of the mesa stripe are buried with the current blocking layers, a contact layer can be formed on not only the mesa stripe but also the current blocking layers. With this structure, the contact of the p-side electrode can be widened, and the contact resistance between the electrode and the semiconductor layer can be reduced to enable low-voltage driving.

If the current blocking layer is formed on a surface on which a layer containing at least Al is exposed, the reactive current flowing through a regrown interface can be decreased. A reliable device having a low threshold current and a low operating voltage can be realized.

The mesa stripe and the current blocking layer can constitute an integral mesa arranged on one contact layer on the buffer layer, while the first electrode can be arranged on the other contact layer next to the mesa.

In this case, if the width of the first portion of the current blocking layer located between the first electrode and the mesa stripe is set smaller than that of the second portion, of the current blocking layer, opposing the first portion via the mesa stripe, the current path can be shortened, and the operating voltage can be decreased.

The width of the first portion of the current blocking layer is desirably set to be three to 20 times that of the mesa stripe. This is because, if the mesa stripe having the double-heterostructure is formed near the mesa, the path of the reactive current flowing through the side surface is elongated compared to the current flowing through the mesa, resulting in an increase in operating voltage.

If the width of the mesa stripe is set to be 1/50 or less the width of the mesa, the mesa stripe can be properly distorted to decrease the threshold current.

If the effective refractive index of the mesa stripe is set lower than that of the current blocking layer, the light guide effect can be attained without extremely narrowing the width of the mesa stripe. A device which has a small astigmatic difference and can stably oscillate in the fundamental transverse mode can be realized.

A mass transport layer can be formed by removing the two sides of the active layer of the mesa stripe by re-evaporation of crystals left in a vapor phase at a high temperature, and growing, at the removed portions, crystals left in a vapor phase at a high temperature. As a result, the crystallinity between the current blocking layer buried in the side surface of the mesa stripe, and the mesa interface can be improved. Since the leakage current in the side surface of the mesa is decreased to effectively inject the current into the active layer, a large-output, short-wavelength semiconductor laser which oscillates with a smaller threshold can be realized.

If a three-layered resist is used to fabricate the mesa stripe, a mask having a vertical side wall can be formed to accurately control the width of the mesa stripe.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described in detail below with reference to the several views of the accompanying drawing.

(First Embodiment)

Figure 1:
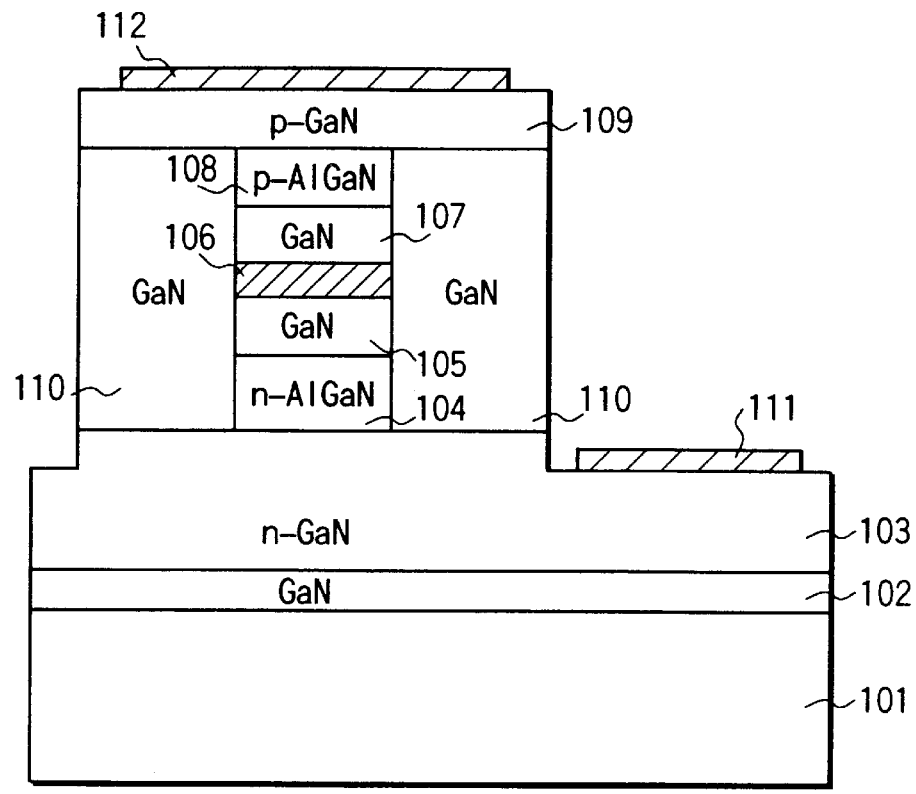
FIG. 1 is a sectional view showing the device structure of a compound semiconductor laser according to the first embodiment.

FIG. 1 is a sectional view showing the device structure of a gallium nitride-based compound semiconductor laser according to the first embodiment of the present invention.

An n-type GaN contact layer 103 is formed on a sapphire substrate 101 via a Gag buffer layer 102. A mesa structure constituted by an n-type AlGaN cladding layer 104, an n-type GaN guide layer 105, an active layer 106 having a multiple quantum well structure (MQW), a p-type GaN guide layer 107, and a p-type AlGaN cladding layer 108 is formed on the contact layer 103. High-resistance GaN current blocking layers 110 each having a refractive index lower than that of the active layer 106 are buried in the two sides of this mesa structure. In the MQW active layer 106, InGaN having a 5% In composition is used as a barrier layer, and InGaN having a 15% In composition is used as a well layer. A p-type GaN contact layer 109 is formed over the mesa structure and the current blocking layer 110.

The current blocking layer 110 is not formed on the entire surface of the contact layer 103, but formed to expose part of the contact layer 103. An n-side electrode 111 is formed on the exposed portion of the contact layer 103, while a p-side electrode 112 is formed on the p-type GaN contact layer 109.

The mesa structure has a striped shape in the front-to-back direction of a sheet surface. The stripe width is set at 0.5 $\mu$m to 3 $\mu$m, and the length in the stripe direction is set at 500 $\mu$m. The lengths of the mesa structure and the current blocking layer in a direction perpendicular to the stripe are set at 200 $\mu$m, and the length of the exposed portion of the n-type GaN contact layer 103 in the direction perpendicular to the stripe is set at 200 $\mu$m.

As a manufacturing process, known metal organic chemical vapor deposition growth (MOCVD) is used. A GaN buffer layer 102 is grown to a thickness of 50 nm on a sapphire substrate 101. An n-type GaN contact layer 103 having a thickness of 4 $\mu$m, an n-type AlGaN cladding layer 104 having a thickness of 1 $\mu$m, an n-type GaN guide layer 105 having a thickness of 0.5 $\mu$m, an MQW active layer 106 having a thickness of 0.3 $\mu$m, a p-type GaN guide layer 107 having a thickness of 0.5 $\mu$m, and a p-type AlGaN cladding layer 108 having a thickness of 1 $\mu$m are sequentially grown on the GaN buffer layer 102.

The stacked films are selectively etched into a mesa shape until the n-type GaN contact layer 103 is exposed, thereby forming a mesa structure. Desirable etching methods include dry etching using chlorine gas and the like, and $SiO_2$ as a mask material, wet etching of dipping a structure in an NaOH solution heated to about 300° C. The surface of the GaN contact layer 103 serving as a mesa structure underlayer is a (0001) plane, and the side surface of the mesa is a (11'00) plane or a (112'0) plane. Note that "x'" means inverted "x".

In the mesa structure fabricated in this manner, the mesa portion is protected, and a high-resistance GaN blocking layer 110 is selectively grown. The high-resistance GaN layer 110 is fabricated by doping zinc. After the high-resistance GaN layer 110 is adjusted to be flush with the p-type AlGaN cladding layer 108, a p-type GaN contact layer 109 is grown to a thickness of 0.3 $\mu$m. The contact layer 109 is doped with an impurity at a high concentration (about $1\times10^{19}$ cm$^{-3}$) in order to widen the current in the lateral direction.

Since the substrate is once taken out of a growing apparatus when the p-type GaN contact layer 109 is grown, an oxide film is formed on the underlying crystal region, and may degrade quality of the crystal of the regrown layer. For this reason, it is desirable to vapor-phase-etch the underlying surface slightly with hydrogen before the regrowing, then to form the p-type contact layer 109. By performing the step, an insulating layer can be prevented from being formed at the interface between the underlying crystal region and the regrown layer.

A low temperature buffer layer may be formed at about 550° C. right before the regrown layer, i.e., the p-type contact layer 109 is formed. With this buffer layer, it is possible to suppress three-dimensional growth in the initial growing mode of the regrown layer, thereby obtaining a two-dimensionally grown flat crystal from the beginning.

The above described two steps may be applied to formation of the high-resistance GaN blocking layer 110 in order to attain the same effects.

By dry etching using $SiO_2$ or the like as a mask, the buried structure fabricated in this manner is etched until part of the n-type GaN layer 103 is exposed. Electrodes are formed by known vacuum evaporation. As for the electrode material, a Ti/Au stacked film 111 is used as an n-side electrode for the n-type GaN contact layer 103, and an Ni/Au stacked film 112 is used as a p-side electrode for the p-type GaN contact layer 109. Annealing is desirably performed at 700° C. for 5 min in order to ohmic-contact the electrodes.

According to this embodiment, the GaN buffer layer 102 for relaxing lattice mismatch is formed on the sapphire substrate 101, and the stacked structure including a double-heterostructure portion is formed on the GaN buffer layer 102. Crystal growth for the double-heterostructure portion can be easily caused, and the quality of each crystal layer can be improved. For this reason, a mesa having a desired shape can be formed by exposing a desired surface by etching for a mesa shape. It becomes relatively easy to regrow a gallium nitride-based compound semiconductor material at a step portion formed upon mesa etching. The mesa side portion can be satisfactorily buried with the gallium nitride-based compound semiconductor.

Generally, a number of interface levels are formed on the side surface of a crystal which is etched only. Such interface levels are apt to cause a leakage current, i.e., an ineffective current, thereby lowering current injection efficiency. For this reason, the interface levels on the side surface of the mesa should be prevented from working. As one of the methods for suppressing the affect of the interface levels, the blocking layer is formed after the side surface of the mesa is covered with, e.g., an oxide film, such as $SiO_2$. In another method, the side surface of the mesa is slightly etched with hydrogen after the mesa is formed, then the blocking layer is formed. The affect of the interface levels are suppressed, by causing the interface levels to be passive with the oxide film in the former method, and by removing irregularity on the crystal surface, which can produce the interface levels, in the latter method.

Since the two sides of the mesa structure are buried with the GaN current blocking layers 110, carriers can be efficiently injected into the active layer 106. Since GaN is used for the current blocking layer 110 to set the refractive index of the current blocking layer 110 to be lower than that of the active layer 106, light can be confined in the active layer 106 to decrease the oscillation threshold. In particular, since the active layer 106 has a multiple quantum well structure, the oscillation threshold can be further decreased.

Since the two sides of the mesa structure are buried with the current blocking layers 110, the p-type GaN contact layer 109 can be formed on not only the mesa structure but also the current blocking layers 110. As a result, the contact of the p-side electrode 112 can be widened, and the contact resistance between the electrode and the semiconductor layer can be reduced to enable low-voltage driving.

(Modification of First Embodiment)

Although the MQW structure constituted by the InGaN barrier layer having a 5% In composition and the InGaN well layer having a 15% In composition is used for the active layer 106 in the first embodiment, single InGaN or a single quantum well structure may be used. The use of the MQW is advantageous due to the following reasons. That is, a lattice defect is easily generated in a layer closer to the substrate than the active layer due to a difference in lattice constant between the substrate and the GaN-based layer. If the MQW is used for the active layer, the lattice can be relaxed to increase the impurity activation ratio of the p-type layer formed above the active layer. The barrier and well layers are not limited to InGaN, and any gallium nitride-based compound semiconductor material $In_xGa_yAl_zB_{1-x-y-z-N}$ ($0 \leq x, y, z, x+y+z \leq 1$) can be used.

Although the first embodiment exemplifies doping of Zn in crystal growth as a method of manufacturing a high-resistance layer as the current blocking layer 110, the resistance can also be increased by inactivating the impurity upon ion-implantation of hydrogen or the like. The etching mask and the growth mask in the manufacturing process are not necessarily limited to $SiO_2$, but may be $Si_3N_4$ or the like. The substrate is not limited to sapphire, but may be an oxide such as spinel or ZnO, a semiconductor such as SiC, GaAs, GaN, ZnSe, or Si, and an insulator such as $MgF_2$.

Figure 2A:
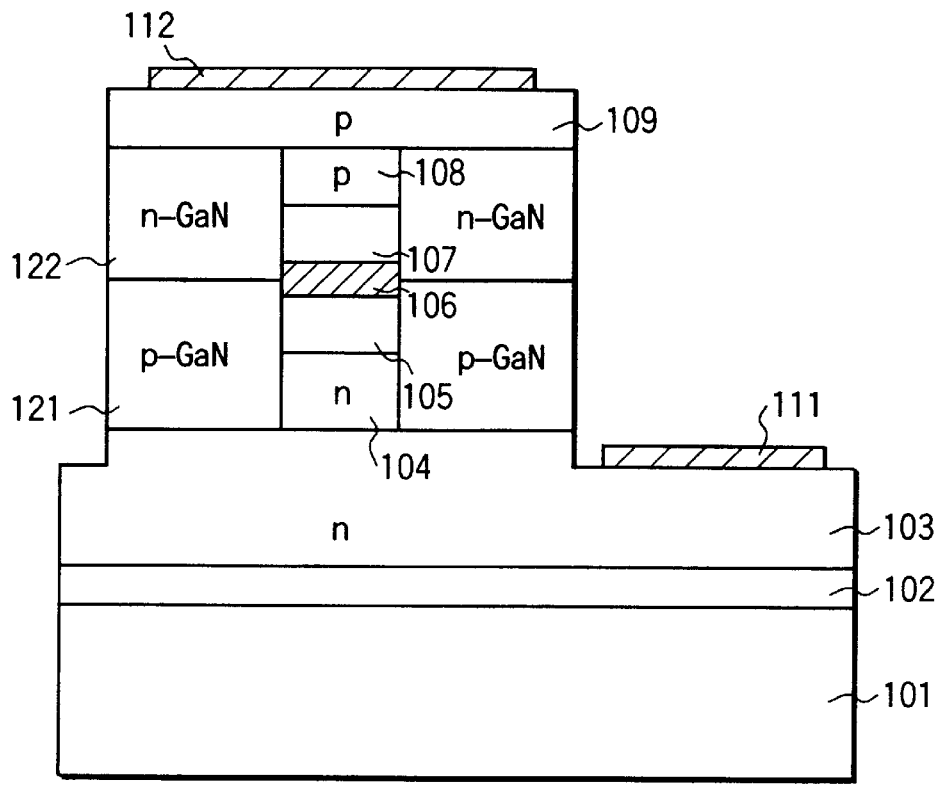
FIGS. 2A and 2B are sectional views, respectively, showing the device structure of a modification of the first embodiment.

The current blocking layer 110 is not limited to high-resistance GaN doped with Zn, but may be AlN, InN, mixed crystals of AlN, InN, and GaN, or an insulating film such as an $SiO_2$ film. Further, as shown in FIG. 2A, a p-type GaN layer 121 and an n-type GaN layer 122 may be stacked to utilize their p-n reverse junction.

Figure 2B:
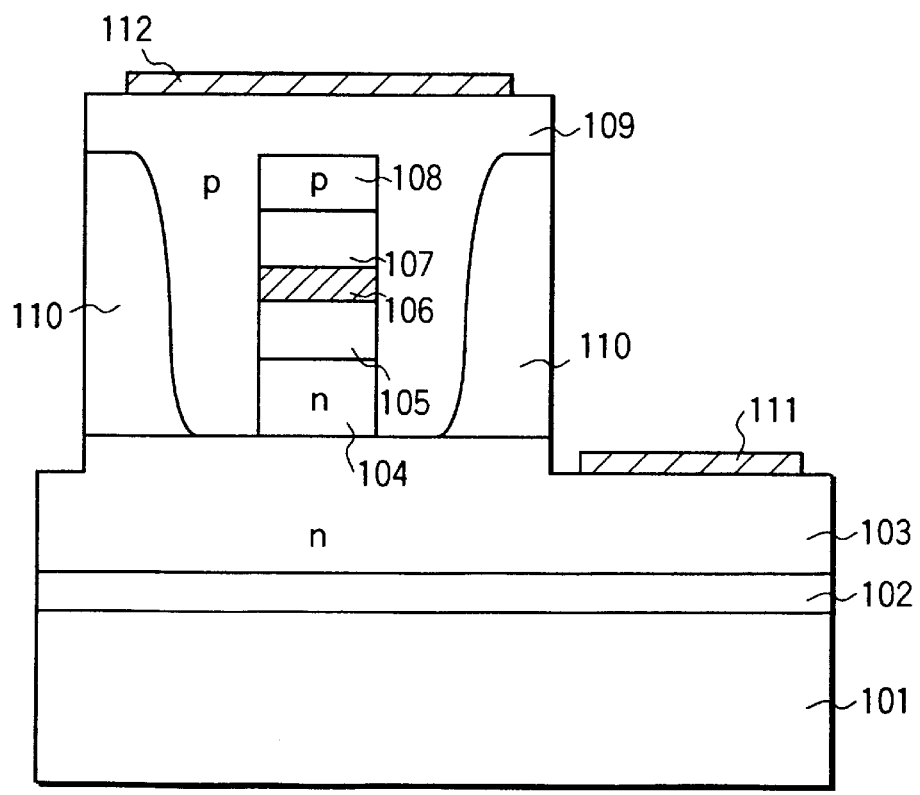

The peripheral structure of the buried layer may be a structure shown in FIG. 2B, instead of a simple buried structure. In FIG. 2B, the p-type GaN contact layer 109 is also formed on the side surface of the mesa structure to suppress diffusion of Zn doped in the current blocking layer (high-resistance layer) 110 to the active layer 106. In this case, the current can be constricted using a built-in potential difference.

(Second Embodiment)

Figure 3A:
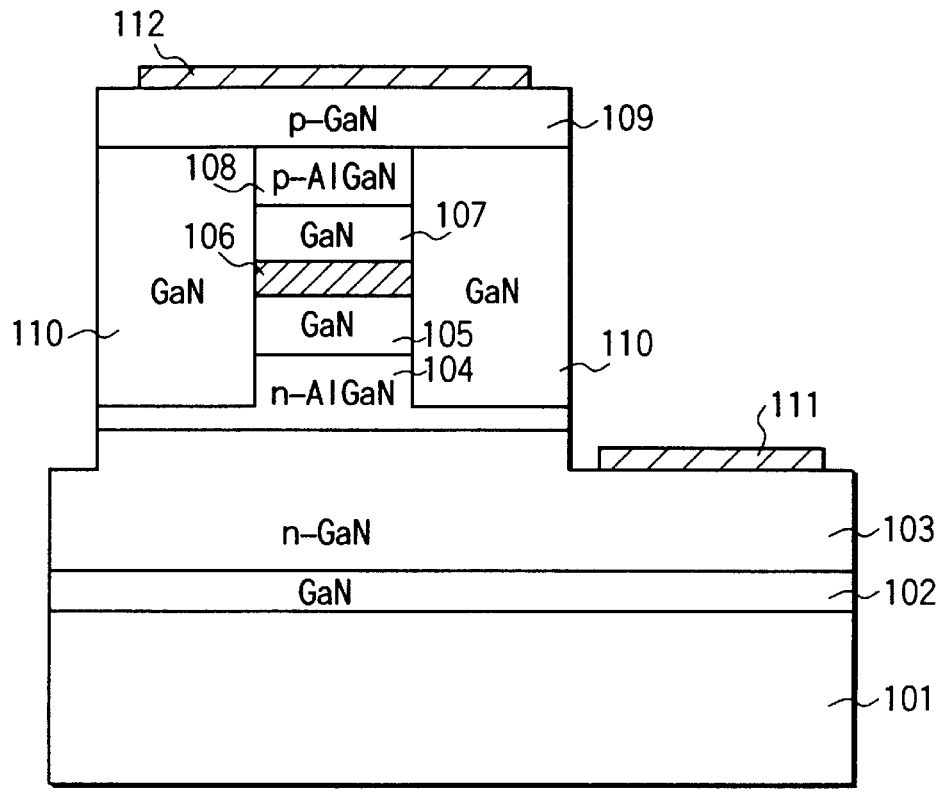
FIGS. 3A and 3B are sectional views, respectively, showing the device structure of a compound semiconductor laser according to the second embodiment.

FIG. 3A is a sectional view showing the device structure of a gallium nitride-based compound semiconductor laser according to the second embodiment of the present invention. The same reference numerals as in FIG. 1 denote the same parts, and a detailed description thereof will be omitted.

The second embodiment is different from the first embodiment in that part of a cladding layer 104 on the substrate side is left in a mesa structure constituted by the cladding layer 104, a guide layer 105, an active layer 106, a guide layer 107, and a cladding layer 108. In this case, a high-resistance GaN current blocking layer 110 not containing Al is buried and grown on the AlGaN cladding layer 104 containing Al.

With this arrangement, the following effect can be obtained in addition to the same effects as in the first embodiment. That is, since the high-resistance GaN current blocking layer 110 contacts not an n-type GaN layer 103 but the n-type AlGaN cladding layer 104, both the leakage current and the threshold can be decreased.

More specifically, in the second embodiment, the surface of the n-type cladding layer 104 is exposed, and the GaN current blocking layer 110 is regrown thereon. In this case, an i-type layer having substantially a high resistance, such as Zn-doped GaN, is preferably used as the current blocking layer 110. The Al-containing surface is GaAlN, InGaAlN, or the like. If the GaN current blocking layer is formed on the Al-containing surface, the generation-recombination current can be suppressed by a hetero-barrier, thereby obtaining a better current constriction effect.

In FIG. 3A, the active layer portion is constituted by sandwiching the MQW active layer between the guide layers, like in FIG. 1. However, the active layer portion does not always have the quantum well structure, and may be a single active layer. The second embodiment can also be variously modified, similar to the first embodiment.

Figure 3B:
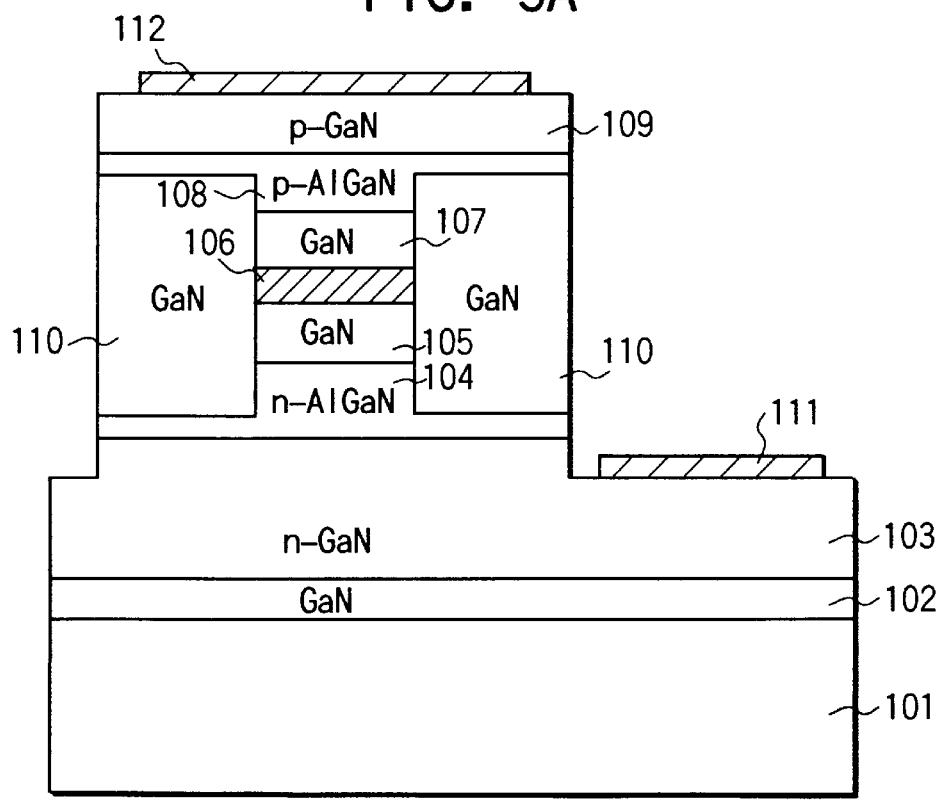

According this embodiment, the p-type GaAlN layer 108 may be also formed on the current blocking layer 110, as shown in FIG. 3B. With this arrangement, the effect of suppressing the generation-recombination current by a hetero-barrier is prominent, thereby enhancing current constriction effect.

(Third Embodiment)

Figure 4A:
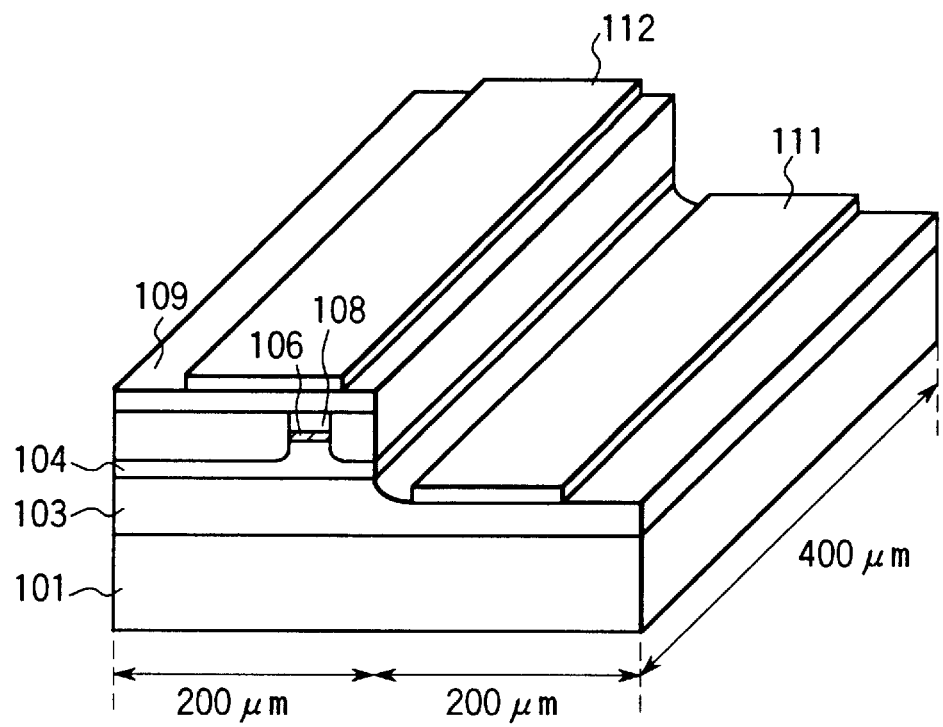
FIGS. 4A and 4B are a perspective view and a sectional view, respectively, showing the device structure of a compound semiconductor laser according to the third embodiment.
Figure 4B:
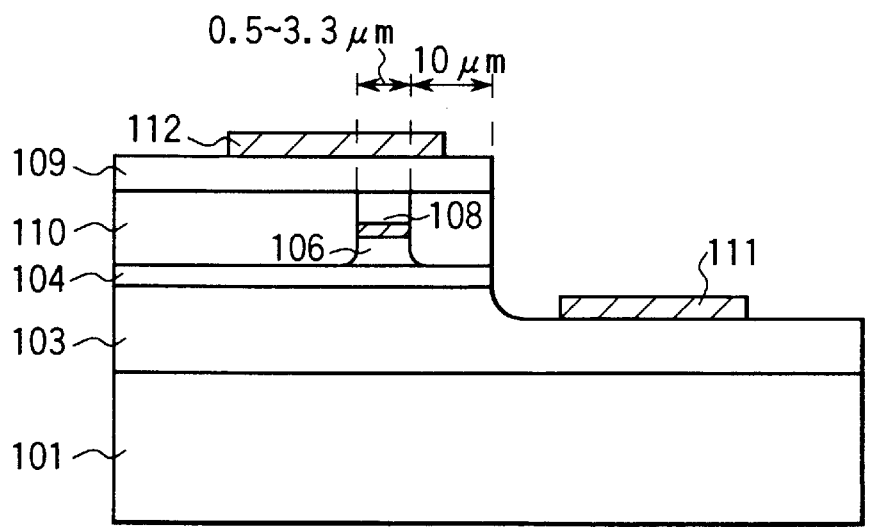

FIGS. 4A and 4B are a perspective view and a sectional view, respectively, showing the device structure of a gallium nitride-based compound semiconductor laser according to the third embodiment of the present invention. The same reference numerals as in FIG. 1 denote the same parts, and a detailed description thereof will be omitted.

The third embodiment is different from the first embodiment in that a mesa double-heterostructure portion is formed nearer an n-side electrode 111 side than the center of the main device portion constituted by the double-heterostructure portion and a current blocking layer. That is, the double-heterostructure portion is formed not at the center of the main device portion but nearer the n-side electrode 111 side. The width of the current blocking layer on the n-side electrode 111 side is 10 $\mu$m.

With this arrangement, the same effects as in the first embodiment can be obtained. In addition, since the stripe portion of the double-heterostructure is nearer the electrode side than the center, the current path can be shortened to decrease the operating voltage.

The distance between the mesa structure portion (stripe portion) formed at the double-heterostructure portion, and the end portion of a mesa structure (main device portion) for forming the n-side electrode is desirably three to 20 times the width of the stripe portion. This is because, if the stripe portion is formed near the end portion of the main device portion, the path of the reactive current flowing through the side surface is elongated compared to the current flowing through the stripe portion, resulting in an increase in operating voltage. From this viewpoint, the width of the stripe portion is set to 0.5 $\mu$m to 3.3 $\mu$m, and the length from the stripe portion to the end portion of the main device portion is set to 10 $\mu$m.

In the arrangement of FIGS. 4A and 4B, the width of the stripe portion is set to be 1/50 or less the width of the main device portion for forming the n-side electrode 111. With this setting, the stripe portion can be properly distorted to suppress the threshold current. In the arrangement of FIGS. 4A and 4B, the effective refractive index of the stripe portion can be set lower than the effective refractive index of a current blocking layer 110. The light guide effect can be attained without extremely narrowing the width of the stripe portion, thereby realizing a device having a small astigmatic difference.

Although the MQW active layer portion is constituted by a single layer in FIGS. 4A and 4B, it may be constituted by sandwiching the MQW active layer between guide layers, as in FIG. 1. The third embodiment can also be variously modified, similar to the first embodiment. The arrangement in which the stripe portion is shifted from the center to the electrode side is also applied to the arrangements shown in FIGS. 2A and 2B and FIG. 3.

(Fourth Embodiment)

Figure 5:
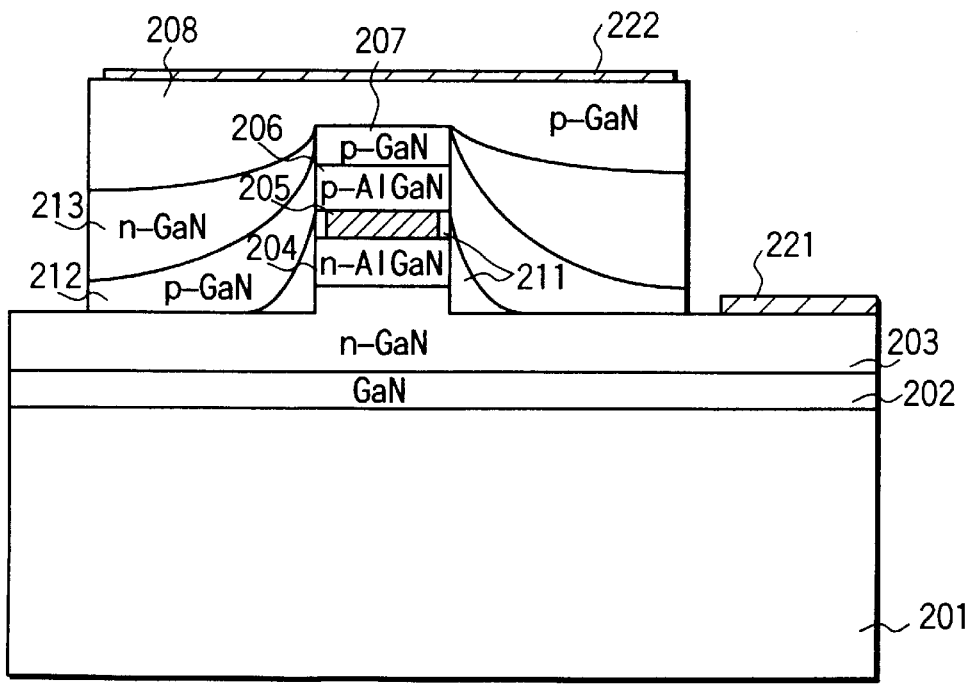
FIG. 5 is a sectional view showing the device structure of a compound semiconductor laser according to the fourth embodiment.

FIG. 5 is a sectional view showing the device structure of a gallium nitride-based compound semiconductor laser according to the fourth embodiment of the present invention.

An n-type GaN contact layer 203 is formed on a sapphire substrate 201 via a GaN buffer layer 202. A double-heterostructure portion constituted by staking an n-type AlGaN cladding layer 204, an InGaN-MQW active layer 205, a p-type AlGaN cladding layer 206, and a p-type GaN layer 207 on the GaN contact layer 203 is formed into a mesa shape.

The two sides of the active layer 205 in the mesa structure are partially removed, and (Al, In) GaN layers (mass transport layers) 211 each having a refractive index lower than that of the active layer 205 are formed at the removed portions. Current blocking layers each constituted by stacking a p-type GaN buried layer 212 and an n-type GaN buried layer 213 are buried in the two sides of the mesa structure.

A p-type GaN contact layer 208 is formed on the mesa structure portion and the n-type GaN layer 213. The respective layers are etched and removed to expose part of the n-type GaN contact layer 203. An n-type electrode 221 is formed on the exposed n-type GaN contact layer 203, while a p-type electrode 222 is formed on the p-type GaN contact layer 208.

In this embodiment, since the (Al, In) GaN layer 211 having a refractive index lower than that of the active layer 205 is formed in contact with the active layer 205, light can be confined in the active layer 205. The current to the active layer 205 can be constricted due to the presence of the p-type GaN buried layer 212 and the n-type GaN buried layer 213, thereby efficiently injecting the current into the active layer 205. That is, although the p-type electrode 222 is formed on the almost entire surface of the p-type GaN contact layer 208, the current is effectively injected into the active layer 205 due to the p-n reverse junction between the buried layers 212 and 213. In this structure, since the contact area of the p-type electrode 222 can be increased, the contact resistance between the electrode and the semiconductor layer can be reduced, low-voltage driving is enabled, and the reliability is greatly improved. Since the device surface is planarized by the p-type GaN contact layer 208, the device can be easily formed into a chip.

In the manufacturing method, RIE is generally used as a method of etching the double-heterostructure into a mesa shape. At this time, the crystal surface is damaged, so that the damaged layer on the surface is removed by etching. However, the gallium nitride-based material is difficult to be removed by wet etching. For this reason, in this embodiment, etching and crystal growth are performed in a crystal growth furnace.

More specifically, after a mesa is formed by dry etching such as RIE, burying and growth are performed by MOCVD or the like. At this time, the NH$_3$ gas flow rate is set to be low, while keeping the substrate temperature at 800° C., the materials are etched. Particularly, the active layer 205 at the mesa portion is easily etched because the etching rate of the InGaN layer is high. The damaged layer can be easily removed by RIE. Subsequently, the NH$_3$ gas flow rate is increased, while keeping the substrate temperature at 800° C., materials are grown at the etched active layer portion and the corner of the mesa bottom portion due to a mass transport process. According to this manufacturing method, the leakage current on the mesa side surface is decreased to effectively inject the current into the active layer 205.

FIGS. 6A to 6D and FIGS. 7A to 7C are sectional views, respectively, showing the manufacturing process in this embodiment.

Figure 6A:
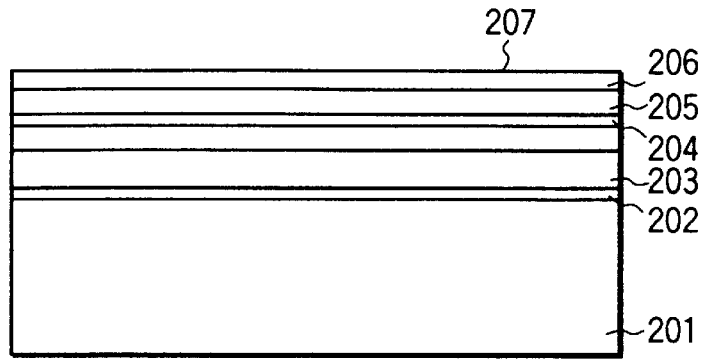
FIGS. 6A to 6D are sectional views, respectively, showing the first half of the process of manufacturing a semiconductor laser in the fourth embodiment.

As shown in FIG. 6A, a GaN buffer layer 202 having a thickness of 50 nm, an n-type GaN contact layer 203 having a thickness of 4 $\mu$m, an n-type AlGaN cladding layer 204 having a thickness of 1 $\mu$m, an InGaN-MQW active layer 205 having a thickness of 0.3 $\mu$m, a p-type AlGaN cladding layer 206 having a thickness of 1 $\mu$m, and a p-type GaN layer 207 having a thickness of 0.5 $\mu$m are sequentially grown on a sapphire substrate 201 by MOCVD.

Figure 6B:
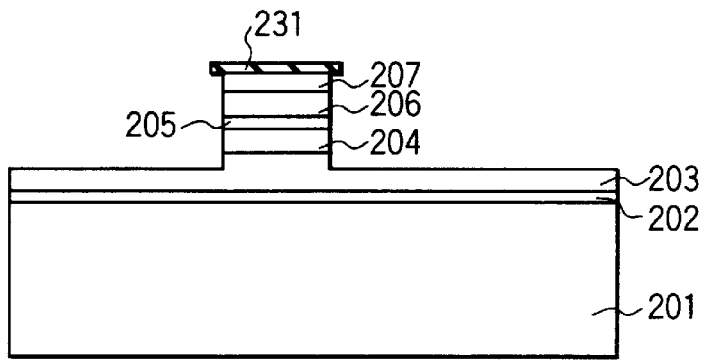

As shown in FIG. 6B, after an SiO$_2$ film 231 is formed on the surface of the p-type GaN layer 207, the obtained structure is patterned by PEP (Photo-Etching Process), etched to expose the p-type GaN layer 207, and etched by RIE until the n-type GaN contact layer 203 is exposed. The SiO$_2$ film 231 may be patterned using a three-layered resist (to be described later).

Figure 6C:
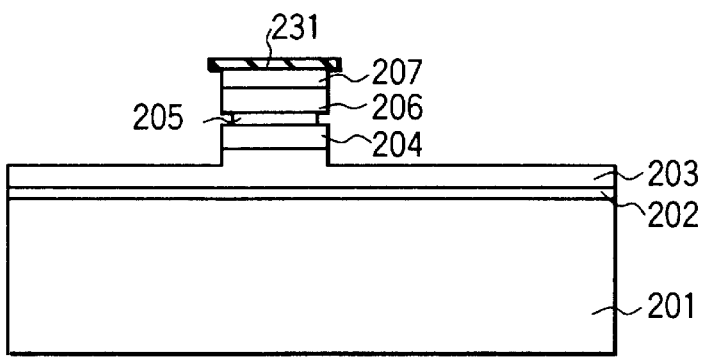

When the resultant structure is held in a MOCVD reaction furnace at 800° C., and NH$_3$ and N$_2$ gases are respectively flowed at flow rates of 2 l/min and 20 l/min, the surface is etched by the gases to particularly remove part of the two sides of the active layer 205, as shown in FIG. 6C.

Figure 6D:
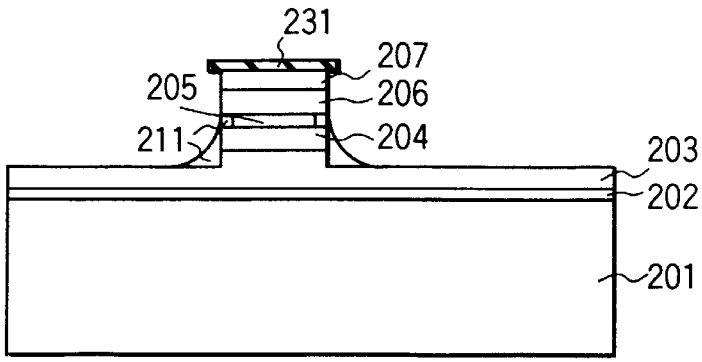

When the NH3 and N2 gases are respectively flowed at flow rates of 10 l/min and 20 l/min, a crystal layer (mass transport layer) 211 is grown to bury corrugations on the mesa surface by mass transport, as shown in FIG. 6D.

Figure 7A:
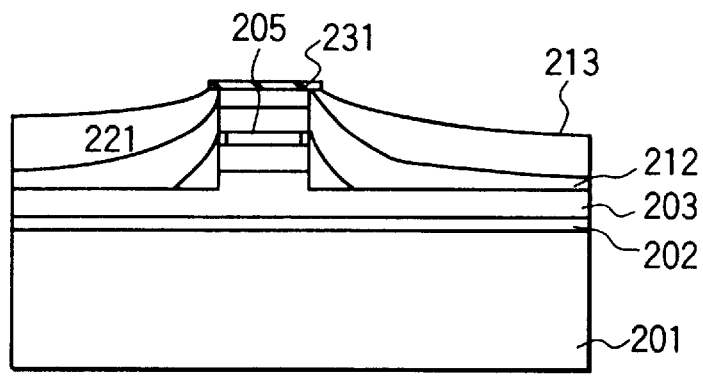
FIGS. 7A to 7C are sectional views, respectively, showing the second half of the process of manufacturing the semiconductor laser in the fourth embodiment.

As shown in FIG. 7A, a current blocking layer constituted by a p-type GaN buried layer 212 and an n-type GaN buried layer 213 is then formed. Note that gas etching of the two sides of the active layer, formation of the mass transport layer, and formation of the current blocking layer can be continuously per-formed in a single reaction furnace to which a source gas for MOCVD is supplied. Therefore, the side surfaces of the mesa structure are not exposed to the outer atmosphere.

Figure 7B:
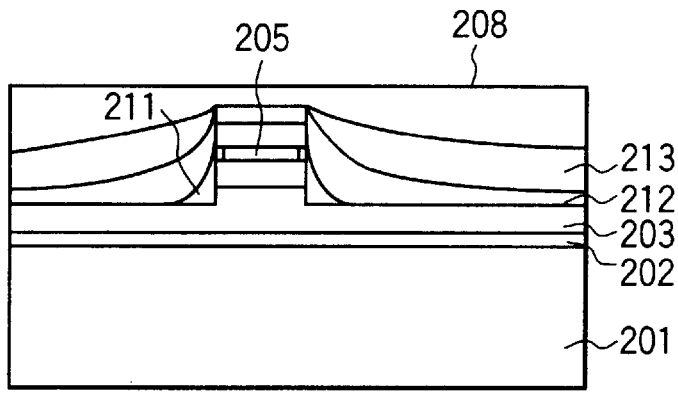

As shown in FIG. 7B, the SiO$_2$ film 231 on the surface is removed to grow a p-type GaN contact layer 208.

Figure 7C:
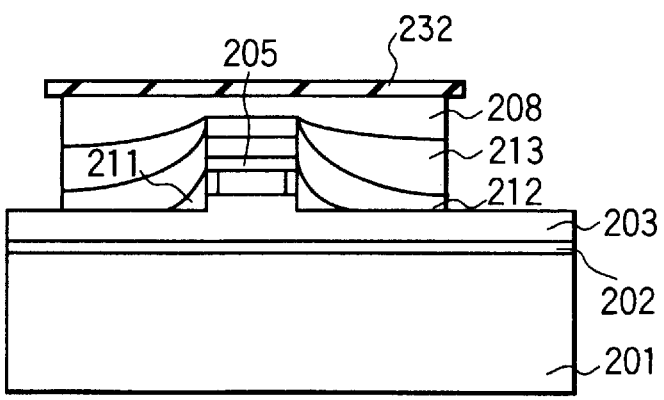

As shown in FIG. 7C, after an SiO$_2$ film 232 is formed, the resultant structure is patterned by PEP and etched to expose the p-type GaN contact layer 208, and further etched by RIE until the n-type GaN contact layer 203 is exposed. After a Ti/Au stacked film is formed as the n-type electrode 221, and an Ni/Au stacked film is formed as the p-type electrode 222, annealing is performed to obtain the structure shown in FIG. 5.

Figure 8A:
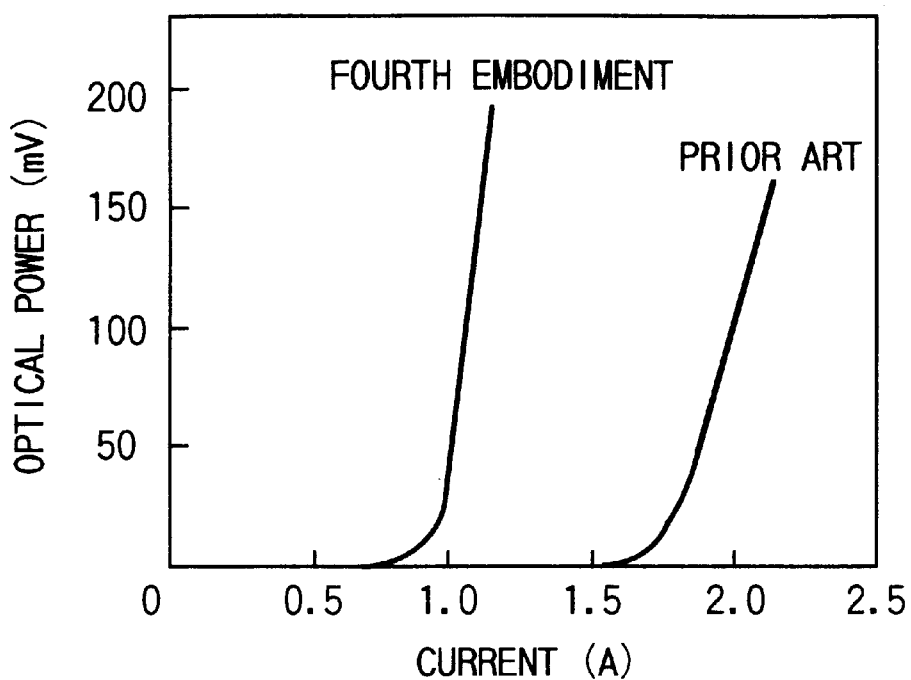
FIGS. 8A and 8B are graphs, respectively, showing the optical power and voltage characteristics of the semiconductor laser in the fourth embodiment.
Figure 8B:
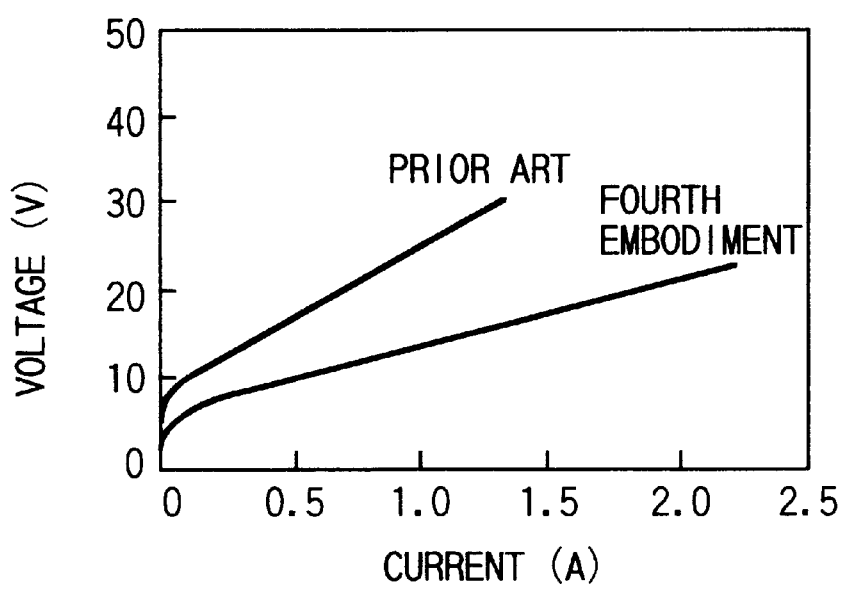

FIGS. 8A and 8B respectively show the measurement results of current-optical power/voltage characteristics of the semiconductor laser obtained in this manner. In this embodiment, the threshold current was about ½ that in a prior art, and good characteristics were obtained. Since the wafer surface was almost flat, the device yield in forming a chip was as high as 90% or more.

(Modification of Fourth Embodiment)

Figure 9A:
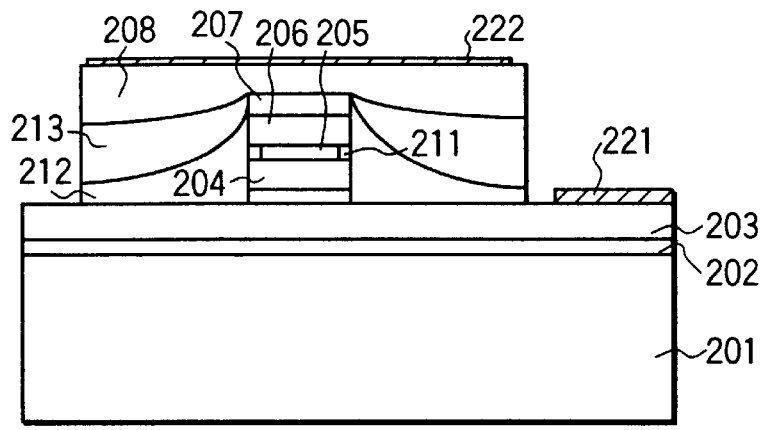
FIGS. 9A to 9C are sectional views, respectively, showing the device structure of a modification of the fourth embodiment.

In the fourth embodiment, the crystal layer 211 by a mass transport process is formed at both the side portion of the active layer 205 and the mesa bottom portion. Alternatively, as shown in FIG. 9A, the crystal layer 211 may be formed at only the side portion of the active layer 205.

Figure 9B:
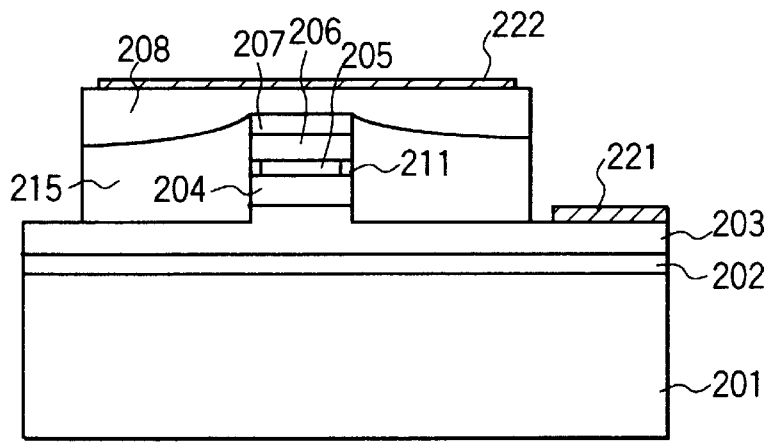
Figure 9C:
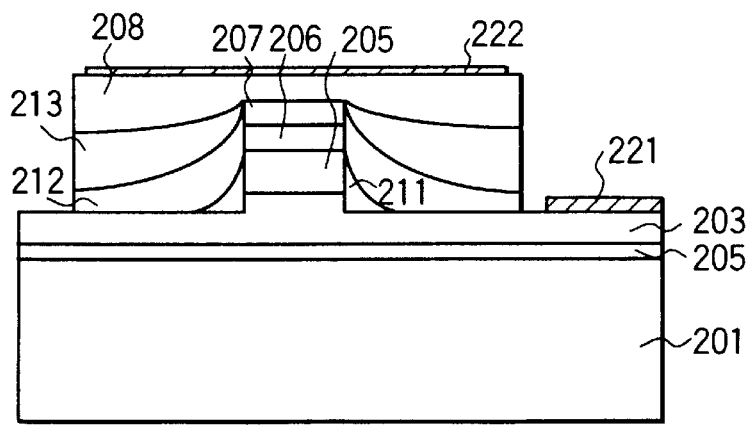

The current blocking layer is not necessarily limited to a layer utilizing a p-n reverse junction, but may be a high-resistance GaN layer 215, as shown in FIG. 9B. Further, the crystal layer 211 may be formed by mass transport after gas etching is performed to a certain degree not to greatly etch the active layer 205, as shown in FIG. 9C. As has been described in the modification of the first embodiment, the arrangement of the active layer, and the arrangement, material, and the like of the current blocking layer can be properly changed in accordance with specifications.

(Fifth Embodiment)

Figure 10:
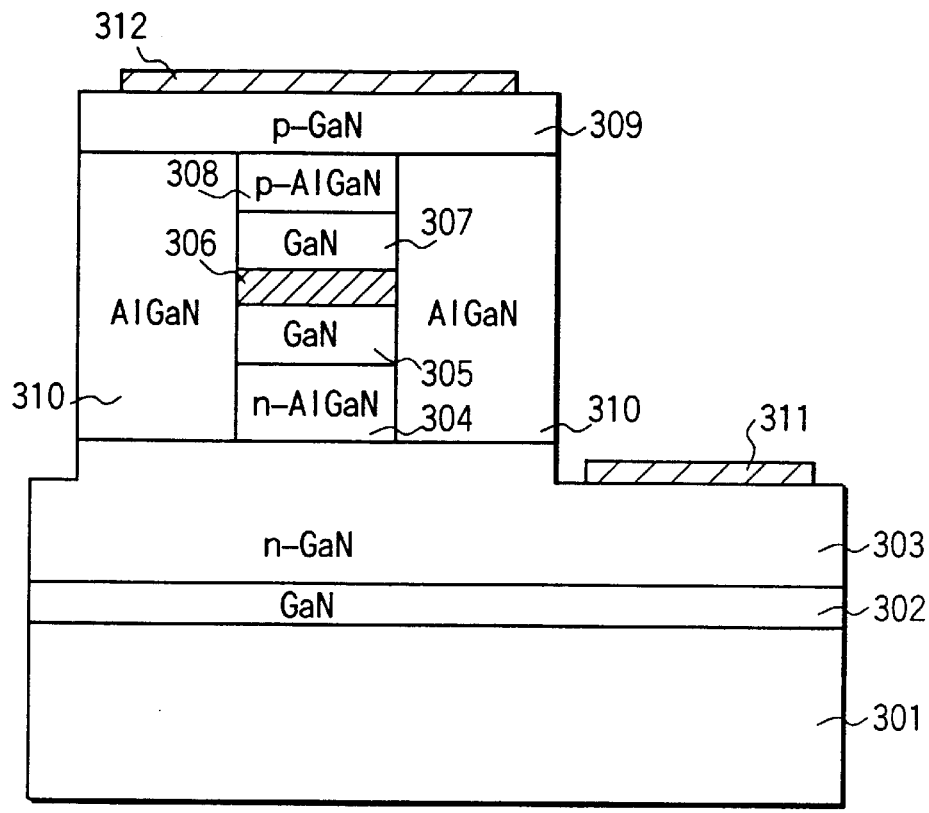
FIG. 10 is a sectional view showing the device structure of a compound semiconductor laser according to the fifth embodiment.

FIG. 10 is a sectional view showing the device structure of a gallium nitride-based compound semiconductor laser according to the fifth embodiment of the present invention. The basic structure is the same as that in the first embodiment shown in FIG. 1.

In FIG. 10, reference numeral 301 denotes a sapphire substrate. A GaN buffer layer 302, an n-type GaN contact layer 303, an n-type AlGaN cladding layer 304, an n-type GaN waveguide layer 305, an MQW active layer 306 formed from InGaN, a p-type GaN waveguide layer 307, a p-type AlGaN cladding layer 308, AlGaN current blocking layers 310, and a p-type GaN contact layer 309 are formed on the substrate 301. The crystal growth of each layer is performed by MOCVD or MBE.

The structure from the p-type AlGaN cladding layer 308 to the n-type AlGaN cladding layer 304 is etched and removed except for a mesa portion. The high-resistance AlGaN current blocking layers 310 are formed on the two sides of the mesa portion. The structure from the p-type GaN contact layer 309 to the n-type GaN contact layer 303 is partially removed. An n-side electrode 311 is formed on the n-type GaN contact layer 303, while a p-side electrode 312 is formed on the p-type GaN contact layer 309.

The active layer portion of this laser has an SCH structure having a multiple quantum well constituted by an $In_cGa_{1-c}N$ well layer and an $In_dGa_{1-d}N$ barrier layer (c>d), and a GaN waveguide layer.

Detailed examples of the composition and thickness of each layer will be described. The multiple quantum well is constituted by five pairs of $In_{0.2}Ga_{0.8}N$ well layers (2 nm) and $In_{0.05}Ga_{0.95}N$ barrier layers (4 nm), and the thickness of each GaN waveguide is 0.1 $\mu$m. The two cladding layers are formed from n-type $Ga_{0.85}Al_{0.15}N$ (0.3 $\mu$m) and p-type $Ga_{0.85}Al_{0.15}N$ (0.3 $\mu$m), respectively.

What is most important is the mesa width for obtaining stable fundamental transverse mode oscillation, and a refractive index difference $\Delta N$ between the active layer portion and the buried layer. If the structure of the active layer portion is determined, $\Delta N$ is determined by the composition of the buried layer. In this embodiment, the buried layer is formed from $Ga_{0.94}Al_{0.06}N$, and the stripe width is set at 1 $\mu$m.

Figure 11:
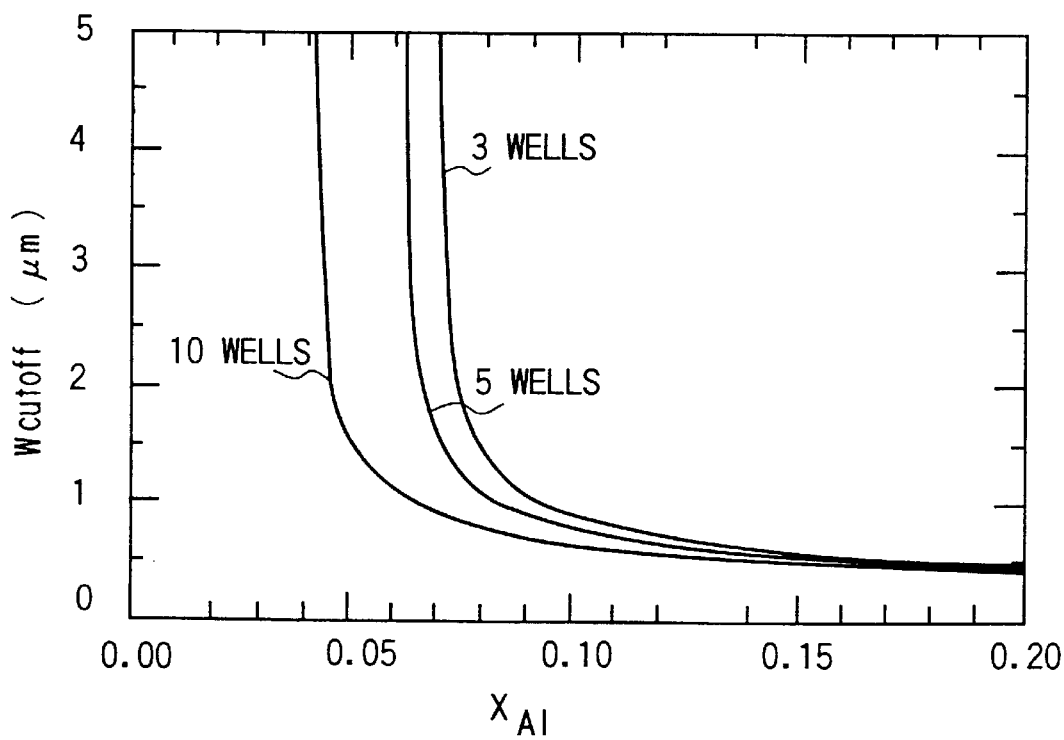
FIG. 11 is a graph showing higher-mode cutoff conditions.

The relationship between the stripe width and the composition of the buried layer for realizing stable fundamental transverse mode oscillation will be described below. FIG. 11 is a graph obtained by plotting a stripe width W for satisfying conditions under which the primary mode (higher mode) of the horizontal transverse mode is cut off with respect to an Al composition "x" of the $Ga_{1-x}Al_xN$ buried layer, i.e., conditions under which only the fundamental transverse mode exists, when a multiple quantum well structure (the parameters of a waveguide layer and a cladding layer are the same as those in FIG. 10) constituted by an $In_{0.2}Ga_{0.8}N$ well layer (2 nm) and an $In_{0.05}Ga_{0.95}N$ barrier layer (4 nm) is used for the active layer portion. To realize stable fundamental transverse mode oscillation, the stripe width W must be set smaller than values indicated by curves in FIG. 11.

The buried structure is suitable for efficiently confining carriers and light, and realizing oscillation at a small threshold. In the gallium nitride-based compound semiconductor laser, the fabrication process of the buried structure must be strictly controlled because the mesa width for obtaining the fundamental transverse mode is small. The mesa width is small due to a short oscillation wavelength, which is an essential problem in the gallium nitride-based compound semiconductor laser.

To attain a relatively large mesa width, the refractive index difference $\Delta N$ in the horizontal direction is decreased, i.e., the Al composition of the buried layer is decreased. As is apparent from FIG. 11, to reliably cut off the higher mode, the mesa width is desirably set at 1 $\mu$m or less because control of $\Delta N$ depends on the composition and the film thickness controllability.

One technique of increasing the mesa width is an anti-waveguide structure. The anti-waveguide structure is a structure in which the refractive index outside the stripe is set higher than that inside the stripe. In this case, the refractive index difference $\Delta N$ has a negative value opposite to that of a normal optical waveguide, but the waveguide mode is formed by a loss or gain difference inside and outside the stripe. The anti-waveguide structure is greatly different from a so-called gain waveguide structure in which the waveguide mode is formed by only a gain difference. That is, the astigmatism of the anti-waveguide structure is small, and its threshold can be decreased.

Figure 12A:
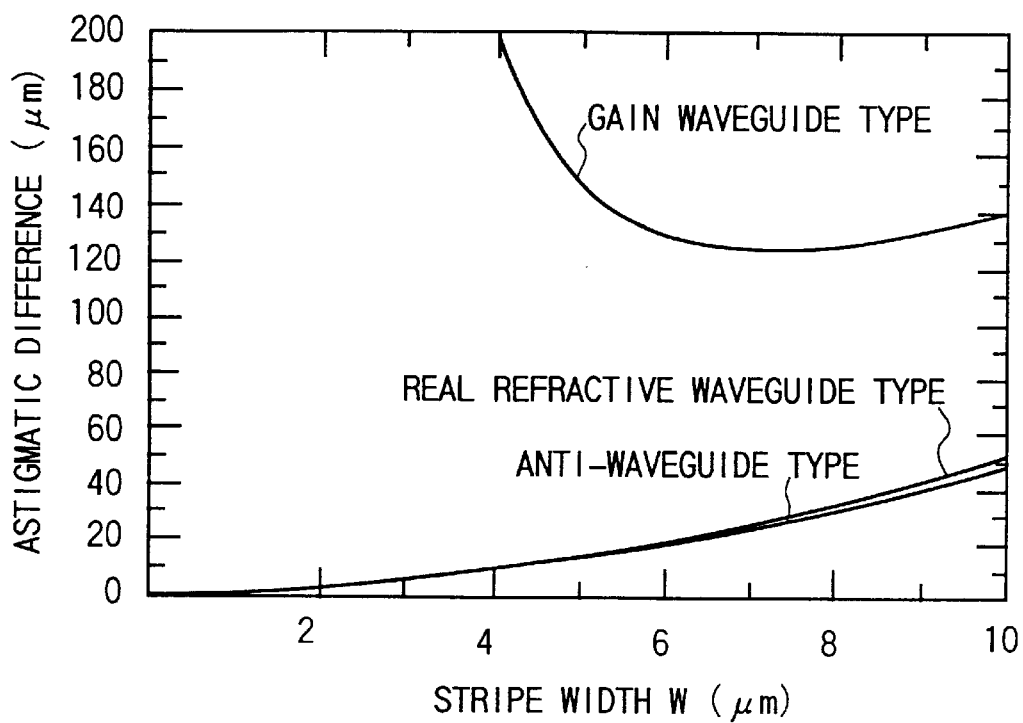
FIGS. 12A and 12B are graphs, respectively, showing the characteristic comparison between a gain waveguide structure, a real refractive index waveguide, and an anti-waveguide structure.
Figure 12B:
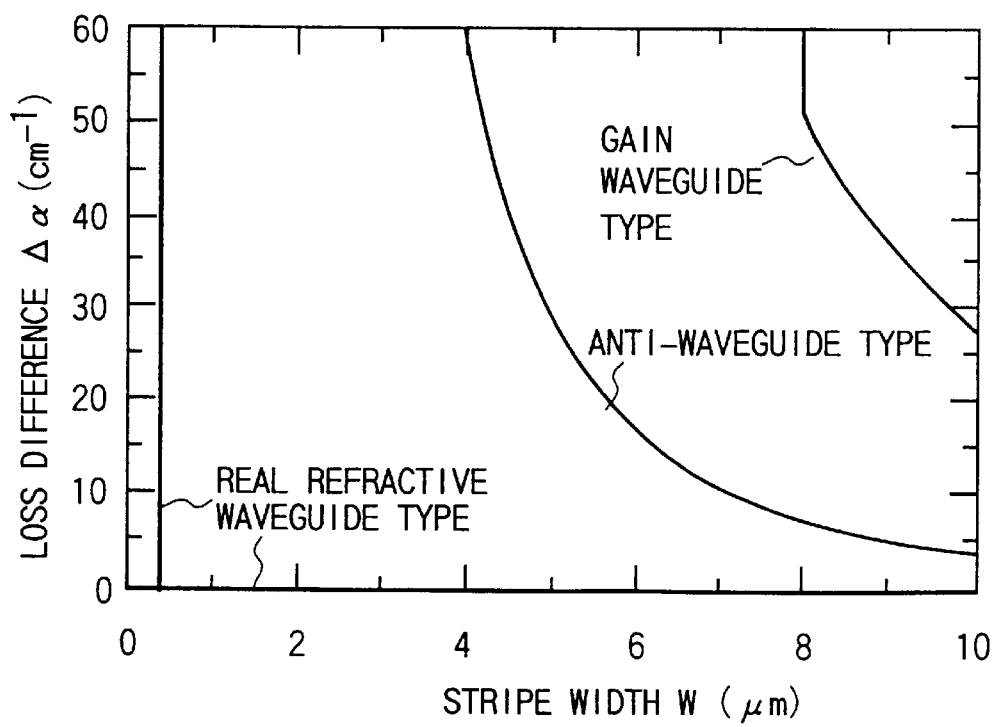

FIGS. 12A and 12B respectively show the stripe width dependence of the astigmatic difference and the loss difference between the primary and fundamental modes in order to compare the gain waveguide structure, a real refractive index waveguide structure, and the anti-waveguide structure. As the loss difference is larger, oscillation in the fundamental transverse mode is more easily attained. As the astigmatic difference is smaller, the structure is more readily used in an application to an optical disk or the like. As is apparent from FIGS. 12A and 12B, since the astigmatic difference of the gain waveguide structure is very large, it cannot be used in the application to the optical disk or the like. In the real refractive index waveguide structure, the astigmatic difference can be decreased. However, since the loss difference between the higher and fundamental modes is essentially 0 in a large-stripe-width range, the stripe width must be controlled to a very small value, as has been described with reference to FIG. 11.

To the contrary, in the anti-waveguide structure, the astigmatic difference can be set as small as that of the real refractive index waveguide structure, while the loss difference between the higher and fundamental modes can be set large even for a relatively large stripe width. An example employing this anti-waveguide structure will be described in the following sixth embodiment.

(Sixth Embodiment)

Figure 13:
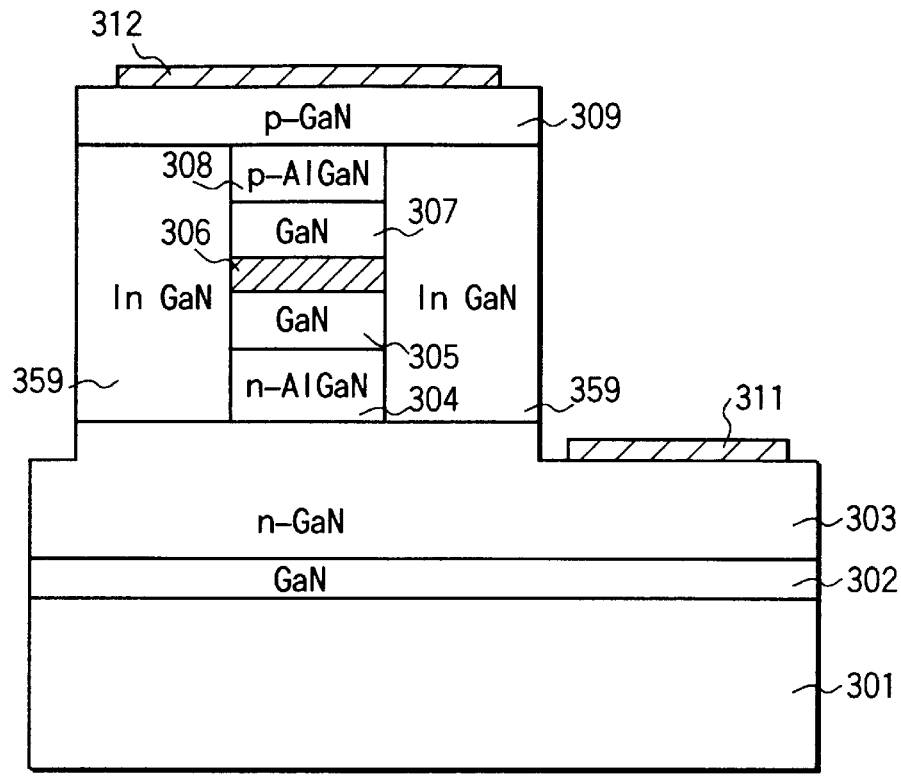
FIG. 13 is a sectional view showing the device structure of a compound semiconductor laser according to the sixth embodiment.

FIG. 13 is a sectional view showing the device structure of a gallium nitride-based compound semiconductor laser according to the sixth embodiment of the present invention. The same reference numerals as in FIG. 10 denote the same parts, and a detailed description thereof will be omitted.

The sixth embodiment is different from the fifth embodiment shown in FIG. 10 in that the current blocking layer is constituted by an $In_{0.2}Ga_{0.8}N$ layer 359. The refractive index of the current blocking layer 359 is higher than the equivalent refractive index of the double-heterostructure portion. Since the band gap of the current blocking layer 359 is equal to that of the well layer constituting the quantum well, the current blocking layer 359 serves as a loss layer for the oscillation wavelength when no carrier is injected at a high resistance. That is, an anti-waveguide structure in which the refractive index outside the stripe is larger than that inside the stripe, and the loss outside the stripe is larger than that inside the stripe is realized.

In this embodiment, the stripe width is set at 3 μm. Such a relatively large stripe width is easily ensured. As will be described later, the allowance of the stripe width is also large in the anti-waveguide structure.

Figure 14A:
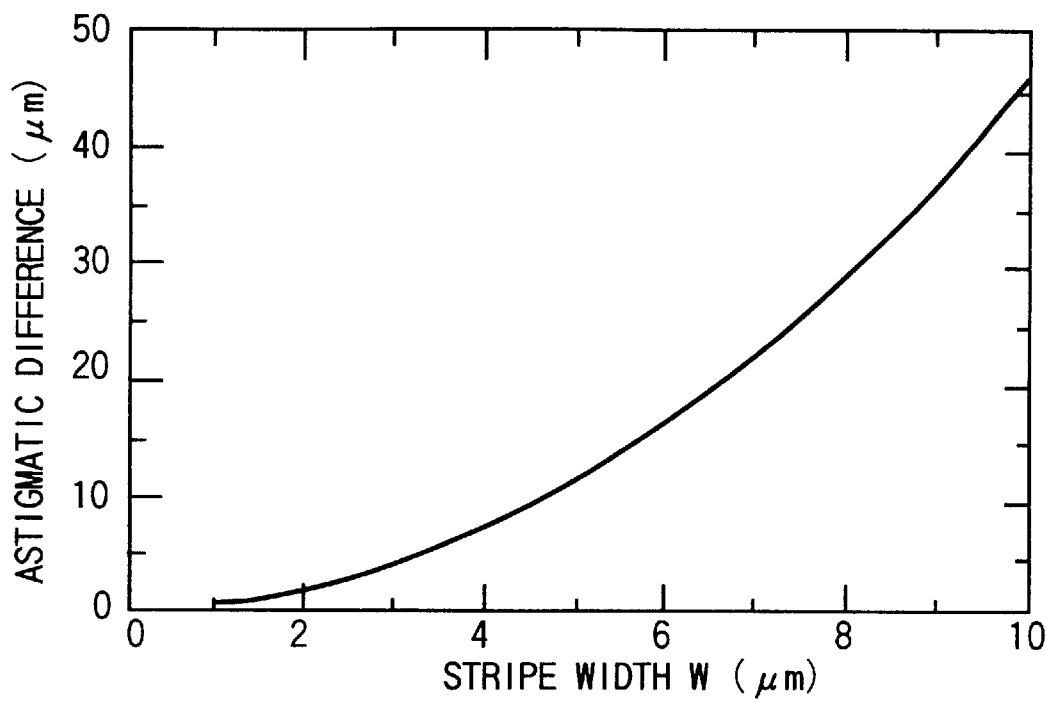
FIGS. 14A and 14B are graphs, respectively, showing the characteristics of a gallium nitride-based compound semiconductor laser having the anti-waveguide structure.
Figure 14B:
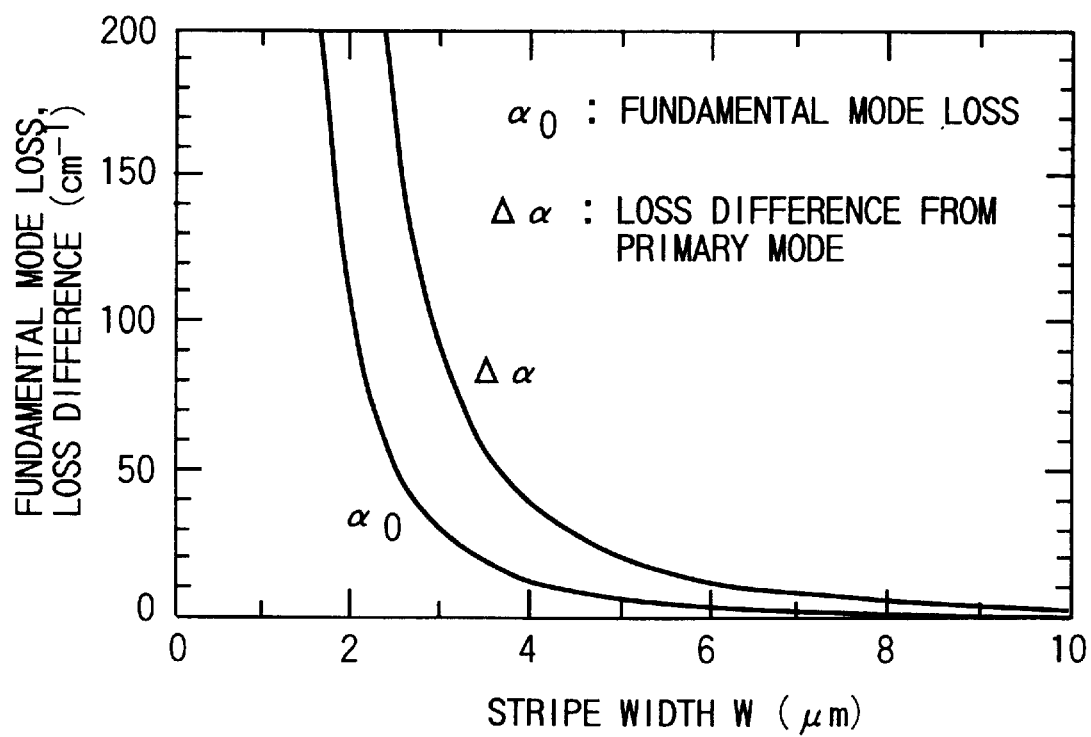

FIGS. 14A and 14B show, respectively, the stripe width dependence of the astigmatic difference, the fundamental mode loss, and the loss difference between the primary and fundamental modes. As has been described with reference to FIGS. 12A and 12B, the astigmatic difference is small in the anti-waveguide structure. As is apparent from FIG. 14B, around a stripe width of 3 μm, the loss difference between the primary and fundamental modes is large, and the fundamental mode loss is also relatively small. Therefore, oscillation is possible in the stable fundamental transverse mode at a small threshold.

(Seventh Embodiment)

Figure 15:
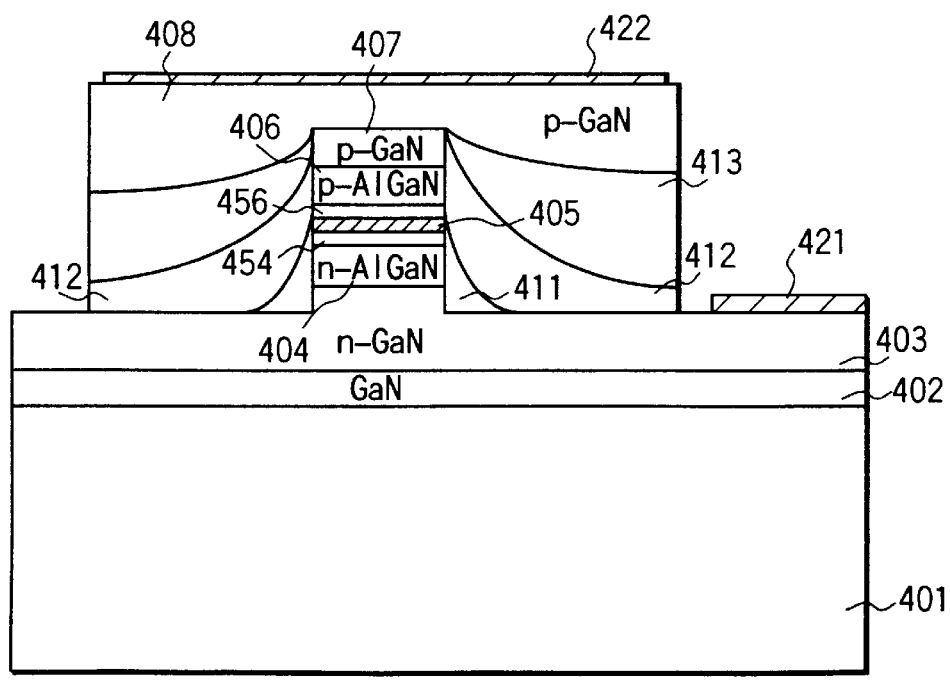
FIG. 15 is a sectional view showing the device structure of a compound semiconductor laser according to the seventh embodiment.

FIG. 15 is a sectional view showing the device structure of a gallium nitride-based compound semiconductor laser according to the seventh embodiment of the present invention. The basic structure is the same as that in the fourth embodiment shown in FIG. 5.

In FIG. 15, reference numeral 401 denotes a sapphire substrate. A GaN buffer layer 402, an n-type GaN contact layer 403, an n-type GaAlN cladding layer 404, an n-type GaN waveguide layer 454, an InGaN multiple quantum well 405, a p-type GaN waveguide layer 456, a p-type GaAlN cladding layer 406, a p-type GaN cap layer 407, a GaN buried layer 411, a p-type InGaN buried layer 412, an n-type GaN buried layer 413, and a p-type GaN contact layer 408 are formed on the substrate 401. Reference numeral 421 is an n-side electrode; and 422, a p-side electrode.

In this embodiment, an anti-waveguide structure is realized by the loss of the p-type InGaN buried layer 412. That is, if the band gap of the buried layer 412 is adjusted to be almost equal to or smaller than that of the well layer portion of the active layer portion, the buried layer 412 can become a layer which gives the loss to the oscillation wavelength. More specifically, the In composition of the p-type InGaN buried layer 412 is set to be equal to or larger than that of the well layer. With this setting, a gallium nitride-based compound semiconductor laser which oscillates in the fundamental transverse mode at a small threshold can be attained.

(Eighth Embodiment)

FIGS. 16A to 16C and FIGS. 17A to 17C are sectional views, respectively, showing the process of manufacturing a gallium nitride-based compound semiconductor laser according to the eighth embodiment of the present invention, and particularly show the process of fabricating the mesa structure of a double-heterostructure portion. This embodiment is applicable to the above-described embodiments.

Figure 16A:
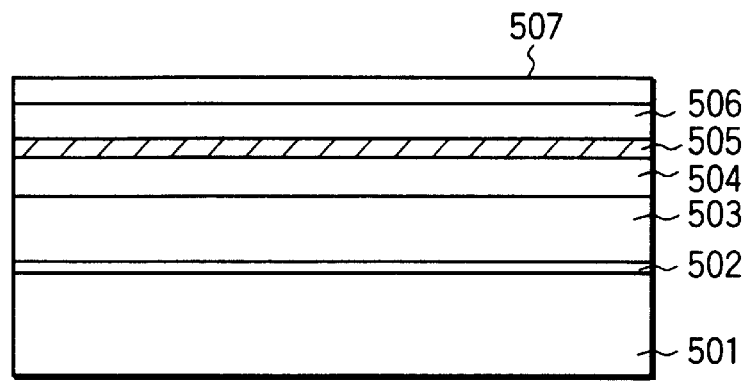
FIGS. 16A to 16C are sectional views, respectively, showing the first half of the process of manufacturing a semiconductor laser according to the eighth embodiment.

As shown in FIG. 16A, a GaN buffer layer 502 is grown to a thickness of 50 nm on a sapphire substrate 501. An n-type GaN contact layer 503 having a thickness of 4 μm, an n-type AlGaN cladding layer 504 having a thickness of 1 μm, an InGaN-MQW active layer 505 having a thickness of 0.3 μm, a p-type AlGaN cladding layer 506 having a thickness of a μm, and a p-type GaN layer 507 having a thickness of 0.5 μm are sequentially grown on the GaN buffer layer 502 by MOCVD.

Figure 16B:
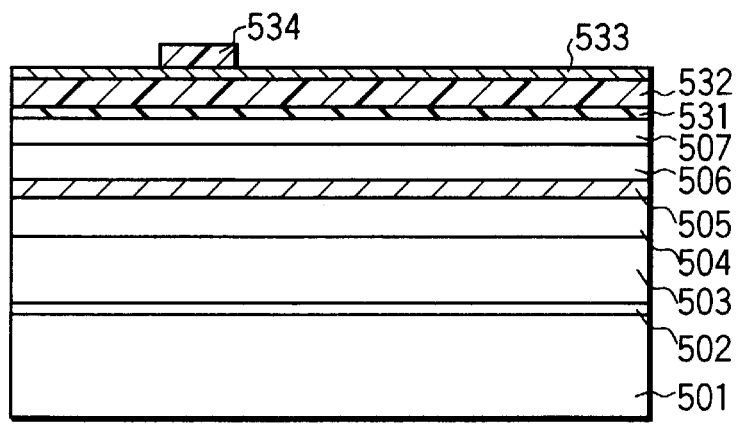

As shown in FIG. 16B, an SiO$_2$ film 531 is deposited to a thickness of 0.4 μm on the p-type GaN layer 507 by thermal CVD. A three-layered resist constituted by a resist/ intermediate layer/resist is formed on the SiO$_2$ film 531. That is, a first resist 532 is applied to a thickness of 3 μm on the SiO$_2$ film 531. After the resultant structure is exposed in a nitrogen atmosphere at 250° C. for 20 min to harden the resist, a Ti (or Al) film 533 is deposited to a thickness of 100 to 200 nm by electron beam deposition, and a second resist 534 is applied thereon to a thickness of 1 μm. The resist 534 is patterned into a stripe shape having a stripe width of, e.g., 1 μm in an optical exposure process.

Figure 16C:
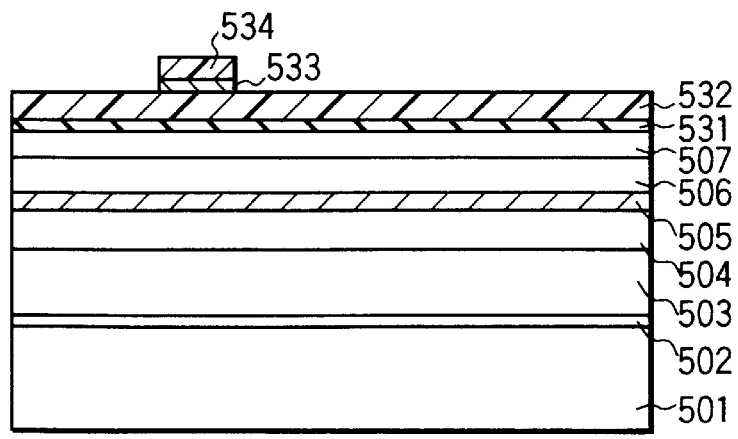

As shown in FIG. 16C, the Ti film 533 is selectively etched with the resist 534 as a mask by reactive ion beam etching (RIBE) using chlorine gas, thereby transferring the stripe pattern to the Ti film 533.

Figure 17A:
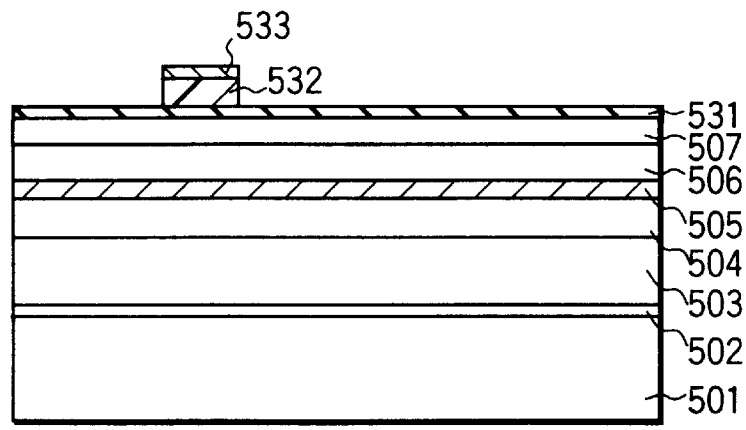
FIGS. 17A to 17C are sectional views, respectively, showing the second half of the process of manufacturing the semiconductor laser according to the eighth embodiment.

As shown in FIG. 17A, the resist 532 is selectively etched with the Ti film 533 as a mask by RIBE using oxygen gas, thereby transferring the stripe pattern to the resist 532. At this time, the resist 532 is satisfactorily resistant to a chlorine plasma because it has already been hardened. With these steps, a resist mask having an almost vertical side wall can be formed.

Figure 17B:
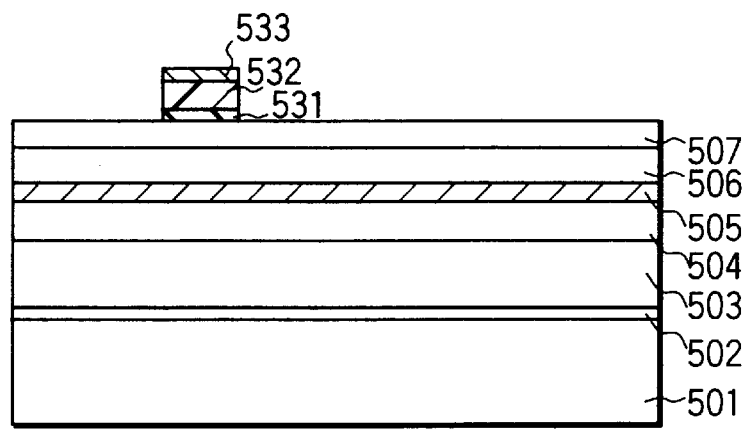
Figure 17C:
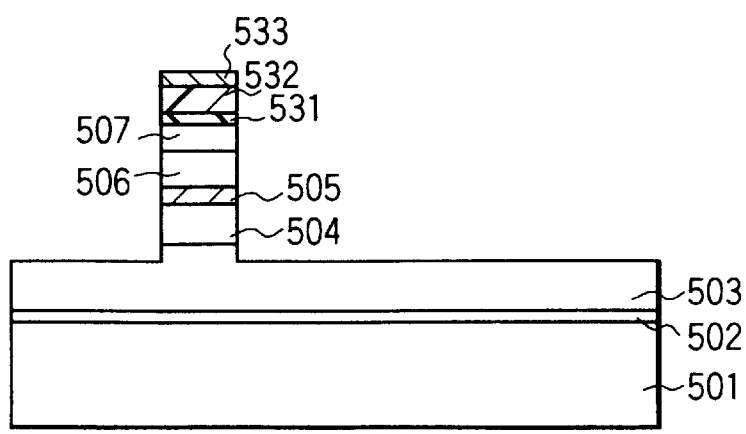

As shown in FIG. 17B, the SiO$_2$ film 531 is selectively etched by RIE using the resist 532 and the Ti film 533 as a mask. As shown in FIG. 17C, selective etching is performed to form a mesa stripe. As a result, a 1-μm wide mesa structure having a double-heterostructure and a vertical side wall can be obtained.

Subsequently, growth of a current blocking layer (buried layer), growth of a contact layer, formation of a mesa structure for forming a substrate-side electrode (e.g., steps shown in FIGS. 6A to 6D and FIGS. 7A to 7C), and formation of electrodes are performed to fabricate a gallium nitride-based compound semiconductor laser.

According to this embodiment, even a narrow mesa stripe can be formed with high controllability by using a three-layered resist. The eighth embodiment is very effective in manufacturing a laser having a buried-hetero structure (BH) like the one described in the first to seventh embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A gallium nitride-based compound semiconductor laser, comprising;

a support substrate;

a mesa stripe formed on said support substrate via a buffer layer, said mesa stripe having a double-heterostructure obtained by sandwiching an active layer between first and second cladding layers of different conductivity types;

first and second current blocking layers buried in two sides of said mesa stripe; and first and second electrodes connected to said first and second cladding layers, wherein each of said buffer layer, said active layer, said first and second cladding layers, and said first and second current blocking layers consists essentially of a material represented by the following composition formnula:

$In_xGa_yAl_zB_{1-x-y-z}N$ where $0 \leq x$, y, z, $x+y+z \leq 1$;

said first and second electrodes are respectively connected to said first and second cladding layers via first and second contact layers consisting essentially of a material represented by said composition formula;

said first contact layer is arranged on or above said buffer layer, said mesa stripe and said first and second current blocking layers constitute an integral mesa arranged on or above said first contact layer, and said first electrode is arranged on said first contact layer beside said mesa; and a width of said first current blocking layer located between said first electrode and said mesa stripe is smaller than a width of said second current blocking layer, opposing said first current blocking layer via said mesa stripe.

2. The laser according to claim 1, wherein said mesa stripe has a width not more than 1/50 that of said integral mesa.

3. The laser according to claim 1, wherein the width of said first current blocking layer is three to 20 times that of said mesa stripe.

4. The laser according to claim 1, wherein said second contact layer has extending portions located between said mesa stripe and said first and second current blocking layers, respectively.

5. The laser according to claim 1, wherein said active layer has a quantum well structure.

6. The laser according to claim 5, wherein said active layer has a multiple quantum well structure.

7. The laser according to claim 1, wherein said first and second current blocking layers have a resistance higher than that of said mesa stripe.

8. The laser according to claim 1, wherein each of said first and second current blocking layers has a plurality of layers stacked to form a p-n junction reverse to that of said double-heterostructure in said mesa stripe.

9. The laser according to claim 1, wherein said first and second current blocking layers have a refractive index lower than that of said mesa stripe.

10. The laser according to claim 1, wherein said first and second current blocking layers have a refractive index higher than that of said mesa stripe.

11. The laser according to claim 1, wherein said first and second current blocking layers are formed on a layer containing at least Al.

12. The laser according to claim 11, wherein said first cladding layer has a lower portion extending to the two sides of said mesa stripe, said first and second current blocking layers are formed on said extending portion, and said first cladding layer contains Al while said first and second current blocking layers do not contain Al.

13. The laser according to claim 1, wherein part of two sides of said active layer is substituted with a mass transport layer having a composition different from that of said active layer and consisting essentially of a material represented by said composition formula.

* * * * *